United States Patent
Pradier et al.

(10) Patent No.: US 9,935,539 B2
(45) Date of Patent: Apr. 3, 2018

(54) SYSTEM AND METHOD FOR CONTROLLING AT LEAST ONE SWITCHING DEVICE, ESPECIALLY FOR USE IN AIRCRAFT

(71) Applicant: Zodiac Aero Electric, Montreuil (FR)

(72) Inventors: Jean-Clair Pradier, Houilles (FR); Stéphane Guenot, Antony (FR)

(73) Assignee: Zodiac Aero Electric, Montreuil (FR)

( * ) Notice: Subject to any disclaimer, the term of this patent is extended or adjusted under 35 U.S.C. 154(b) by 299 days.

(21) Appl. No.: 14/827,098

(22) Filed: Aug. 14, 2015

(65) Prior Publication Data

US 2016/0049868 A1 Feb. 18, 2016

(30) Foreign Application Priority Data

Aug. 14, 2014 (FR) .................................... 14 57843

(51) Int. Cl.
| | |
|---|---|
| *B60L 1/00* | (2006.01) |
| *B60L 3/00* | (2006.01) |
| *H02G 3/00* | (2006.01) |
| *H02M 3/04* | (2006.01) |
| *B64D 47/00* | (2006.01) |

(Continued)

(52) U.S. Cl.
CPC ............. *H02M 3/04* (2013.01); *B64D 47/00* (2013.01); *G06F 11/1641* (2013.01); *H02J 3/00* (2013.01); *H03K 17/18* (2013.01); *H03K 17/691* (2013.01); *G06F 11/182* (2013.01); *H02H 1/0015* (2013.01); *H02H 1/0092* (2013.01); *H02H 3/08* (2013.01); *H02H 5/04* (2013.01)

(58) Field of Classification Search
CPC ............................ H02M 3/04; H05B 37/0254

USPC .......................................................... 307/9.1
See application file for complete search history.

(56) References Cited

U.S. PATENT DOCUMENTS

7,505,820 B2 * 3/2009 Plivcic ..................... H02J 1/14
307/43
9,160,174 B2 * 10/2015 Simper ..................... H02J 4/00
(Continued)

FOREIGN PATENT DOCUMENTS

| EP | 0 743 577 A1 | 11/1996 |
|---|---|---|
| WO | 97/18502 A1 | 5/1997 |

OTHER PUBLICATIONS

United Kingdom Search Report, dated Jan. 27, 2016, issued in corresponding Application No. GB1514124.5, filed Aug. 11, 2015, 1 page.

*Primary Examiner* — Lincoln Donovan
*Assistant Examiner* — Metasebia Retebo
(74) *Attorney, Agent, or Firm* — Christensen O'Connor Johnson Kindness PLLC

(57) ABSTRACT

System, especially for use in aircraft, for controlling at least one switching device (5, 5b, 5n) able to open or close the connection between at least one power source and at least one supplied device, and means for measuring the state of the power supply channel. The system comprises: at least two microcontrollers (1a, 1b) each able to emit a command intended for each switching device (5, 5b, 5n), said microcontrollers (1a, 1b) being connected to at least one portion of the means for measuring the state of the power supply channel; and a means (14, 14b, 14n) for determining the command to be transmitted, able to determine the command to be transmitted to each switching device (5, 5b, 5n) from the commands emitted by each microcontroller (1a, 1b) and intended for said control switch.

11 Claims, 7 Drawing Sheets

(51) Int. Cl.
*H02J 3/00* (2006.01)
*G06F 11/16* (2006.01)
*H03K 17/18* (2006.01)
*H03K 17/691* (2006.01)
*G06F 11/18* (2006.01)
*H02H 1/00* (2006.01)
*H02H 3/08* (2006.01)
*H02H 5/04* (2006.01)

(56) References Cited

U.S. PATENT DOCUMENTS

2004/0010324 A1   1/2004   Bednar
2010/0222900 A1   9/2010   Kakino

* cited by examiner

SYSTEM AND METHOD FOR CONTROLLING AT LEAST ONE SWITCHING DEVICE, ESPECIALLY FOR USE IN AIRCRAFT

The technical field of the invention is the control of power distribution systems, and more particularly the safe control of such systems.

The invention relates to the use of a centralised architecture for controlling and protecting power electronics the function of which is to convert electrical power statically or dynamically.

Static electrical power distribution functions employing semiconductor-based components are referred to as Solid State Power Controllers (SSPCs). These functions are distributed between SSPC channels and SSPC boards.

SSPC channels are used to distribute electrical power to aircraft loads depending on logic signals originating from control means connected to the avionics of the aircraft. SSPC channels are also used to protect the lines that transmit electrical power to aircraft loads. The expression "aircraft loads" is understood to mean pieces of electrical equipment that consume delivered power. SSPC boards complement the SSPC channels as regards the protection of distribution lines and are generally incorporated into secondary power distribution systems, due to the medium power transmitted.

In addition, because of the medium power transmitted by each supplied line, a plurality of SSPC channels may be grouped together and controlled by one SSPC board.

Each SSPC channel firstly comprises a switching device, which closes or opens a connection between a power source and a load. The switching device comprises one or more semiconductor-based switches or transistors, especially JFETs (junction field-effect transistors), MOSFETs (metal oxide field-effect transistors), IGBTs (insulated-gate bipolar transistors), bipolar transistors or thyristors, etc. The fabrication technology of these semiconductor devices may be specific to the material used, which may in particular be Si, SiC or GaN. The switching device is associated with one or more sensors, especially current and voltage sensors, in order to allow a fault (especially an overcurrent, short-circuit or the appearance of an electrical arc) to be detected, relative to a nominal operating case.

The SSPC board dynamically controls and configures a plurality of aspects of the SSPC channel, especially the current rating of the channel (current that the line will see in normal operation), activation or not of each built-in protective function and the ability to zero a field indicating that the SSPC channel has been controlled open because of the appearance of a fault. For these reasons, and because of the complexity of certain protection rules governing the behaviour of the SSPC board, the latter is very often controlled by a microcontroller. The microcontroller may, at the choice of the user, be referenced with respect to the electrical ground of its electronics, i.e. to the level of the power bus, the microcontroller therefore having to be isolated from low-level functions of the SSPC board. In this case, the architecture is said to be isolated. If not it may be referenced to the electrical ground of the low-level functions of the SSPC board. In this case the architecture is said to be non-isolated.

The SSPC board comprises main functions, referred to as low-level functions, a few examples of which are listed below.

A general power supply function allows power to be supplied to the electronic functions of the board and transparency time to be managed.

Functions enabling communication with the exterior are performed by way of blocks for interfacing with discrete signals (allowing the SSPC channels to be controlled, pin programming to be carried out and information to be returned) and communication gateways allowing, via digital data buses, information such as control, monitoring and BITE (built-in test equipment) information to be exchanged with the SSPC channels.

Measurement functions allow the current flowing in the SSPC channel, and the voltage and temperature of the switching device to be determined.

Functions for limiting leakage current allow the leakage current of the switching device to be compensated.

Likewise, the following are the main functions carried out by each of the SSPC channels:
  low-voltage power supply, for generating the supply voltage of the following functions:
  control electronics of the SSPC;
  electronics for rapid short-circuit detection;
  electronics for clamping short-circuit faults; and
  voltage and current measurement functions.

The microcontroller, which manages protection of the SSPC channel, may be connected to a communication gateway or be directly coupled to an aircraft communication bus. The SSPC channel is generally, for reasons of availability, connected to at least two control devices. Adopted architectures, whether isolated or not, generally use one microcontroller per SSPC channel, as illustrated in FIG. 1.

FIG. 1 shows the various possible galvanic isolations. A first isolation (3, 3b, 3n) is possible between the communication gateway and the microcontroller (1, 1b, 1n). A second isolation (5, 5b, 5n) is possible between the microcontroller and the SSPC channels (2, 2b, 2n). In the case of an isolated architecture, the first isolation (3, 3b, 3n) is implemented, whereas the second isolation (5, 5b, 5n) is not implemented. In the case of a non-isolated architecture, the second isolation (5, 5b, 5n) is implemented, whereas the first isolation (3, 3b, 3n) is not implemented.

FIGS. 2 and 3 illustrate isolated and non-isolated architectures for control/protection of an SSPC channel.

FIG. 2 illustrates a galvanic isolation 3 placed upstream of the microcontroller 1, the output of the microcontroller 1 being directly connected to various means for controlling (6, 7, 8) and monitoring 9 the SSPC channel, and especially to the switching device 5. Internal power is delivered by way of a DC/DC converter 10 completing the galvanic isolation 11 separating the isolated zone 12 from the non-isolated zone 13.

FIG. 3 illustrates a galvanic isolation 4 placed downstream of the microcontroller 1, before the connection to the various means for controlling (6, 7, 8) and monitoring 9 the SSPC channel, and especially to the switching device 5. However, a measuring means 9b directly connects the microcontroller 1 to the distribution line controlled by the switching device 5.

Internal power is delivered by way of a DC/DC converter 10 completing the galvanic isolation 11 separating the isolated zone 12 from the non-isolated zone 13.

The architecture shown in FIG. 1 has multiple drawbacks.

The higher the number of SSPC channels the greater the area occupied by the protective functions, one SSPC channel corresponding to the use of one microcontroller dedicated to protection of the line. This multiplication of components is accompanied by an increase in cost, in dissipated power and in real estate occupied, to the detriment of the useful area available for the power portions of these very SSPC channels.

Furthermore, the higher the number of SSPC channels, the shorter the mean time before failure (MTBF) of the SSPC board, the microcontroller and its peripherals being a very substantial contributor to the MTBF value of an electronic board.

Another drawback resides in the need to use extra microcontrollers dedicated to communication functions, in addition to those ensuring the protection of the lines. The existence of these extra microcontrollers is accompanied by an increase in the number of signals exchanged with the SSPC channel and therefore by an increase in routing complexity. An alternative consists in coupling the microcontroller of the SSPC channel directly to a bus.

Unfortunately, increasing the number of participants per bus increases the risk of saturation of the data bus and the probability of loss on the bus.

Multiplying the number of microcontrollers also complexifies management of communications with the communication gateway of the SSPC board. Specifically, it is not conceivable to process sequentially the transfer of control commands from the communication gateway to the microcontrollers managing the protection of the SSPC channels, barring placing constraints on the reactivity of the SSPC board.

In a three-phase configuration, it is necessary for the three microcontrollers associated with a given three-phase group to be linked; specifically an often specified requirement is that all three lines open on the appearance of a fault on one of the SSPC lines. This requirement means that, in the case where a plurality of microcontrollers is used, either the microcontrollers must communicate with each other, or they must communicate with a common gateway.

There is a need for a system and method for controlling switching devices allowing safe and effective control to be exercised with a smaller number of components relative to the prior art.

One subject of the invention is a system, especially for use in aircraft, for controlling at least one switching device able to open or close the connection between at least one power source and at least one supplied device, and means for measuring the state of the power supply channel. The system comprises: at least two microcontrollers each able to emit a command intended for each switching device of a power supply channel, said microcontrollers being connected to at least one portion of the means for measuring the state of the power supply channel; and a means for determining the command to be transmitted, able to determine the command to be transmitted to each switching device from the commands emitted by each microcontroller and intended for said switching device.

The means for determining the command to be transmitted may comprise three inputs carrying a command signal originating from three microcontrollers, the input carrying the command signal of a first microcontroller being connected to a NOT logic gate, the input carrying the command signal of a second microcontroller and the input carrying the command signal of a third microcontroller being connected to a first AND logic gate, the NOT logic gate and the first AND logic gate being connected to a second AND logic gate, the input carrying the command signal of the second microcontroller and the input carrying the command signal of the third microcontroller being connected to a first OR logic gate, the input carrying the command signal of the first microcontroller and the first OR logic gate being connected to a third AND logic gate, the second AND logic gate and the third AND logic gate being connected to a second OR logic gate, the output of the second OR logic gate being connected to the output of the means for determining the command to be transmitted.

The means for determining the command to be transmitted may comprise four inputs connected pairwise to two microcontrollers, the four inputs carrying two command signals each originating from one microcontroller, and two validity signals, each also originating from one microcontroller, the second microcontroller ensuring the redundancy of the first microcontroller, the input carrying the command signal of the first microcontroller and the input carrying the validity signal of the first microcontroller being connected to a first NAND logic gate, the input carrying the command signal of the second microcontroller and the input carrying the validity signal of the second microcontroller being connected to a second NAND logic gate, the input carrying the validity signal of the first microcontroller and the second NAND logic gate being connected to an OR logic gate, the first NAND logic gate and the OR logic gate being connected to a third NAND logic gate, the output of the third NAND logic gate being connected to the output of the means for determining the command to be transmitted.

The means for determining the command to be transmitted may comprise four inputs connected pairwise to two microcontrollers, the four inputs carrying two command signals each originating from one microcontroller, and two validity signals, each also originating from one microcontroller, the second microcontroller ensuring the redundancy of the first microcontroller, the input carrying the command signal of the first microcontroller and the input carrying the validity signal of the first microcontroller are connected to a first NAND logic gate, the input carrying the command signal of the second microcontroller and the input carrying the validity signal of the second microcontroller are connected to a second NAND logic gate, the input carrying the validity signal of the first microcontroller and the second NAND logic gate are connected to a first OR logic gate, the first NAND logic gate and the first OR logic gate are connected to a third NAND logic gate, the input carrying the command signal of the first microcontroller and the input carrying the command signal of the second microcontroller being connected to a second exclusive OR logic gate, the input carrying the validity signal of the first microcontroller and the input carrying the validity signal of the second microcontroller being connected to a fourth AND logic gate, the second exclusive OR logic gate and the fourth AND logic gate being connected to a fifth AND logic gate, the third NAND logic gate and the fifth AND logic gate being connected to a sixth NAND logic gate, and the third NAND logic gate being connected to a NOT logic gate, the NOT logic gate and the fifth AND logic gate being connected to a seventh NAND logic gate, the sixth NAND logic gate being connected to the first input of an eighth NAND logic gate, the seventh NAND logic gate being connected to the second input of a ninth NAND logic gate, the output of the ninth NAND logic gate being connected to the second input of the eighth NAND logic gate, the output of the eighth NAND logic gate being connected to the first input of the ninth NAND logic gate, the output of the eighth NAND logic gate also being connected to the output of the means for determining the command to be transmitted.

Another subject of the invention is the use of the system described above and of its variants, in a power distribution system of an aircraft comprising at least one power supply channel comprising at least one switching device.

Moreover, another subject of the invention is a method, especially for use in aircraft, for controlling a switching device able to open or close the connection between at least one power source and at least one supplied device, by means of a control system comprising: means for measuring the state of the connection; and at least two microcontrollers each able to emit a command intended for each switching device, said microcontrollers being connected to at least one portion of the means for measuring the state of the connection.

The method comprises a step in which the command transmitted to each switching device is determined from the commands emitted by the microcontrollers and intended for each switching device.

A command corresponding to the command received from most of the microcontrollers may be transmitted as output, the control system comprising an uneven number of microcontrollers higher than three.

Each microcontroller may emit a command able to take a first value or a second value and a validity value able to take a first value if the command is judged valid by the microcontroller and a second value if the command is judged invalid by the microcontroller, a second microcontroller ensuring the redundancy of the first microcontroller. If the commands received as inputs are accompanied by different validity values, the command received as input for which the validity value corresponds to the first value is transmitted, or, if different commands received as inputs are accompanied by validity values corresponding to the second validity value, the first command value is transmitted, or, if identical commands received as inputs are accompanied by validity values corresponding to the second validity value, the first command value is transmitted.

If different commands received as inputs are accompanied by validity values corresponding to the first value, the command transmitted by the first microcontroller may be transmitted.

If different commands received as inputs are accompanied by validity values corresponding to the first value, the command received beforehand may be transmitted.

Another subject of the invention is the use of the method described above and of its variants, to control the power distribution system of an aircraft comprising at least one power supply channel comprising at least one switching device.

The invention defined above has many advantages. A first advantage resides in the decrease in the number of microcontrollers required, which allows the useful area available for power portions to be increased, the cost of components to be decreased, the total power dissipated by the protective functions to be decreased and the MTBF of the electronic board to be increased, the microcontroller and its peripherals being very substantial contributors to the MTBF value of an electronic board and especially of an SSPC board.

A second advantage corresponds to the centralisation of the protection and control functions in a single microcontroller, thereby making it possible to better manage, in a three-phase configuration, control of the SSPCs associated with a given three-phase group. Specifically, it is, for safety reasons, often necessary to open all three phases on the appearance of a fault on one of the SSPC lines.

Lastly, another advantage is due to the fact that the microcontroller centralising the protective functions may also play the role of a communication gateway for communication with the exterior. Thus, the internal communication buses between the protecting microcontroller and the communication gateway are no longer required.

DESCRIPTION OF THE DRAWINGS

Other aims, features and advantages of the invention will become apparent on reading the following description, which is given merely by way of nonlimiting example and with reference to the appended drawings, in which.

DETAILED DESCRIPTION

Below, a non-isolated centralised control and protection architecture is described, this architecture being associated with a power portion the function of which is to distribute electrical power statically or dynamically.

The use of this novel control and protection architecture is here described below in the context of an SSPC application. However, it may be generalised to devices for controlling power distribution.

Figure 1:
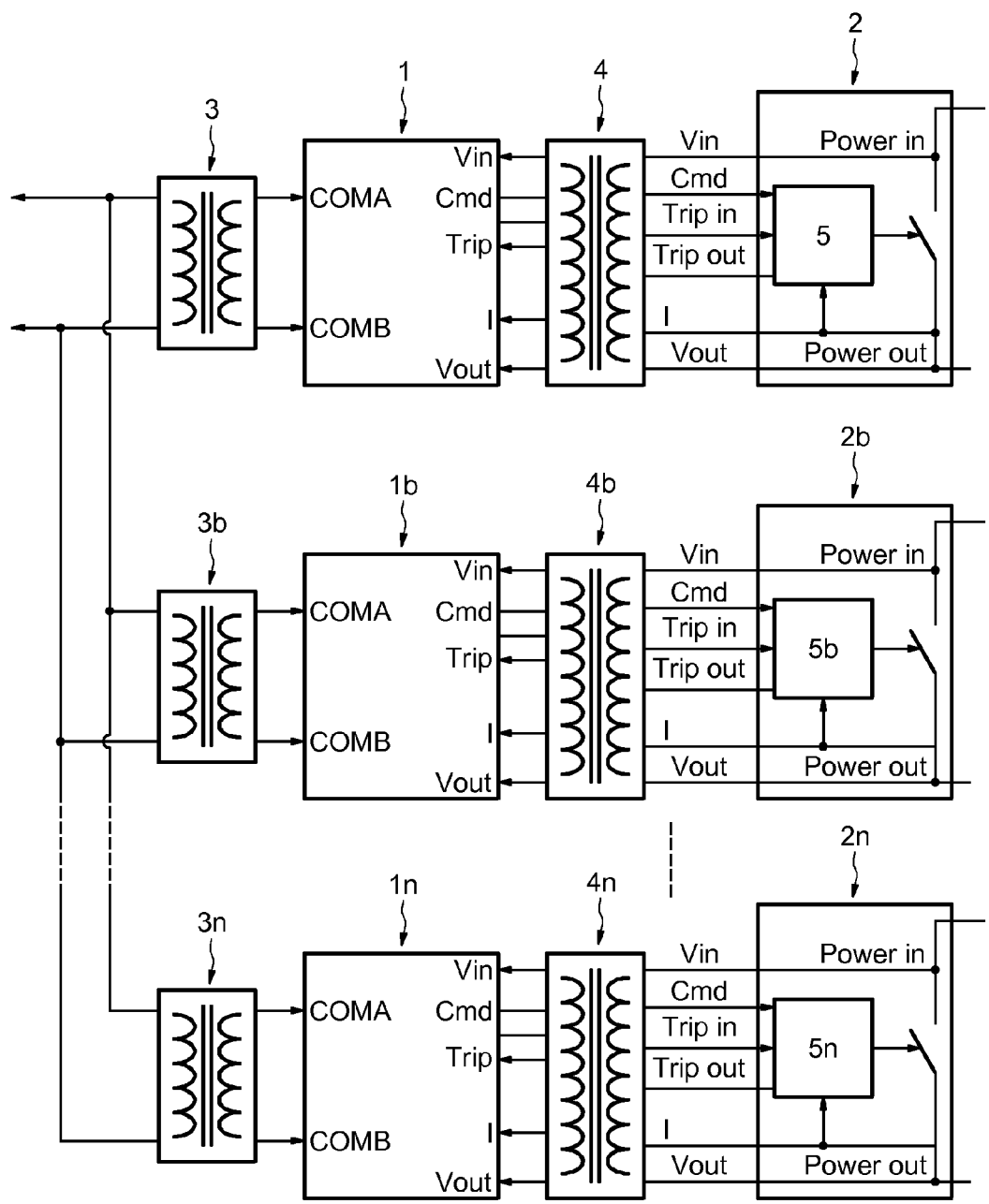
FIG. 1 illustrates a general architecture for controlling and protecting SSPC channels.
Figure 2:
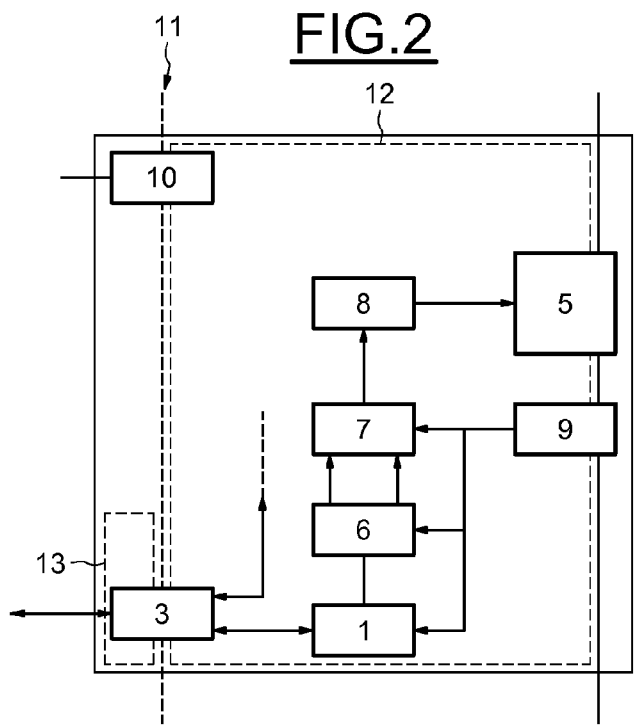
FIG. 2 illustrates an isolated architecture for controlling and protecting SSPC channels.
Figure 3:
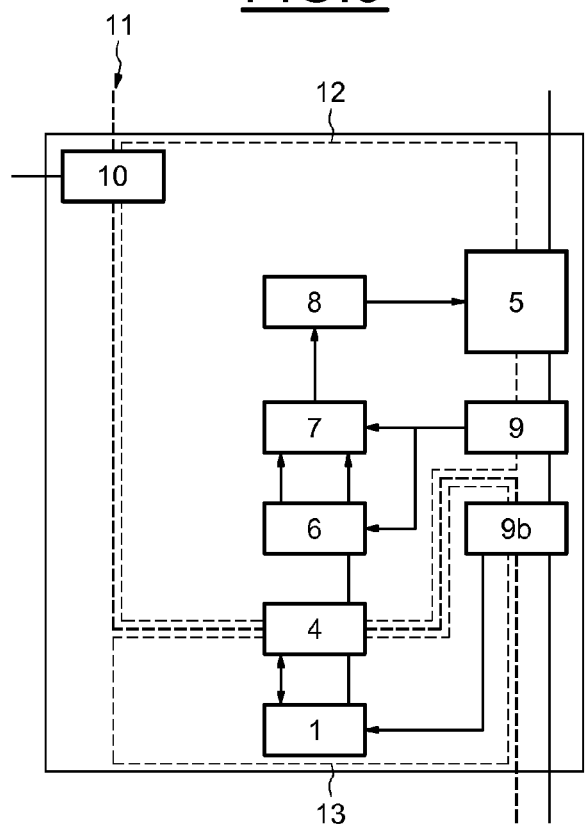
FIG. 3 illustrates a non-isolated architecture for controlling and protecting SSPC channels.
Figure 4:
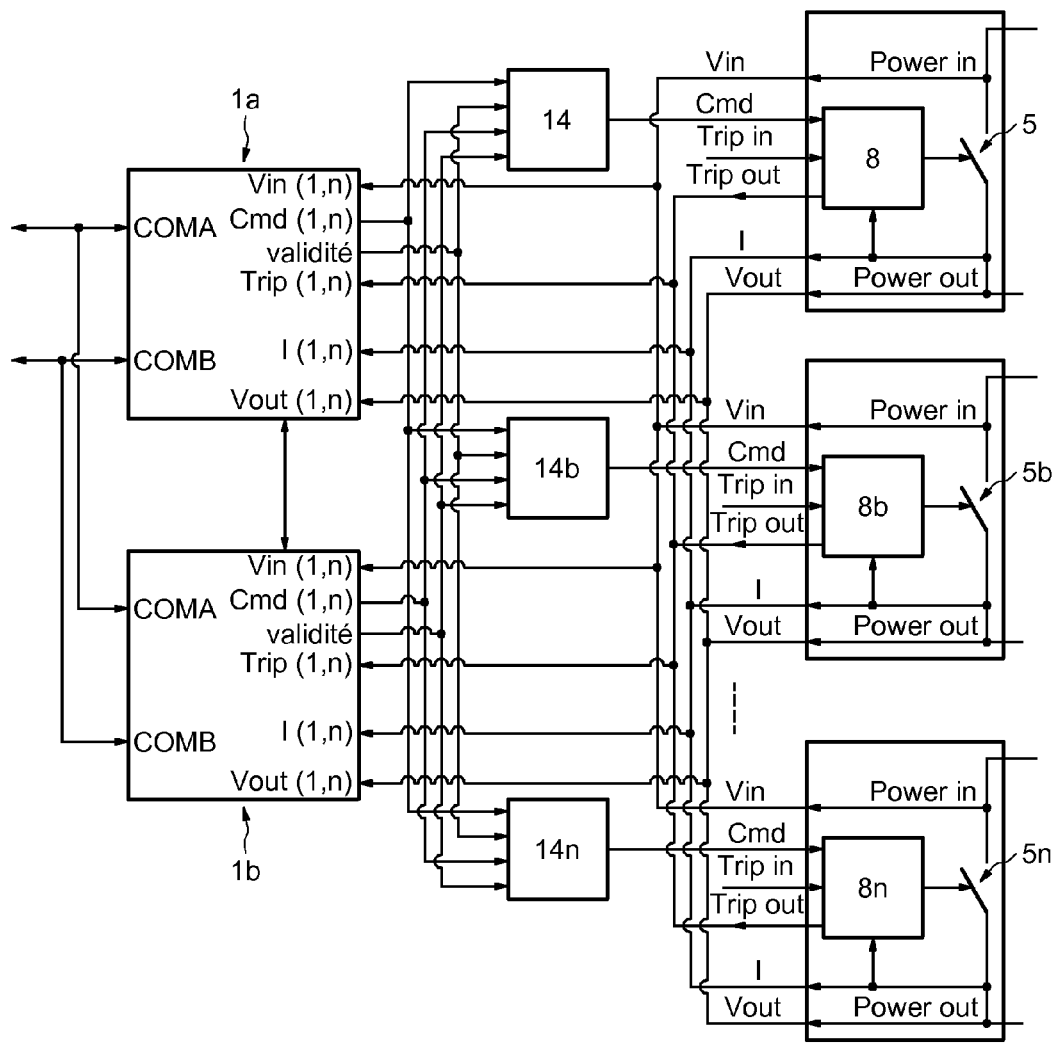
FIG. 4 illustrates an architecture for controlling and protecting an SSPC channel according to the invention.

The capacities of state-of-the-art microcontrollers make it possible to envision providing, in a given component, a substantial computational power. Because of technical developments in the field of microelectronics, the computational power of microprocessors should only continue to increase in the future. Thus, the use of a single microcontroller in place of a plurality may be considered. This perspective has led to the inception of a novel control and protection architecture, which is illustrated in FIG. 4 in a context of SSPC use.

The following description is given while considering microcontrollers. However, it is easily generalisable to any type of control means able to emit the required signals as output.

In this architecture, a single microcontroller is associated with all or some of the SSPC channels of the SSPC board. An SSPC channel is a particular example of a power supply channel. The present description may be generalised to the case of a power supply channel.

Moreover, if the processing capacity of the microcontroller is insufficient, at least one additional microcontroller may be employed so that the sum of the processing capacities of the microcontrollers is higher than or equal to the processing capacity required to manage all the SSPC channels. As described above, each microcontroller may interface with a communication bus or be directly connected to an aircraft bus. Furthermore, it emits control commands intended for devices (8, 8b, 8n) for controlling the SSPC channels, and receives signals (Vin, Vout, I, Trip_out) originating from sensors of the SSPC channels.

In the present case, a microcontroller emits a command possibly taking two states, depending on whether the switching device of the SSPC channel must be open or closed.

In the case where one microcontroller is enough to control the entirety of the SSPC channels, there remains a risk of loss of all of the SSPC channels in the case of failure of this microcontroller. It is therefore necessary, in such a case, to provide at least two microcontrollers (1a, 1b), each microcontroller being able to control all of the SSPC channels.

This observation may be generalised to a system comprising a plurality of microcontrollers, each microcontroller controlling a group of SSPC channels. In order not to lose a group of SSPC channels because of failure of the controlling microcontroller, it is necessary to make provision for a redundancy in each microcontroller controlling a group of SSPC channels. Thus, for a set of channels requiring the processing capacity of n microcontrollers, 2n microcontrollers are provided so that each microcontroller is made redundant by another microcontroller dedicated to the management of the same group of SSPC channels.

However, seeing as two microcontrollers emit simultaneously commands intended for a given group of SSPC channels, it is necessary for a means for determining the command to be transmitted to determine which control commands must be transmitted to the SSPC channel, so that a single microcontroller remains the master of the group of SSPC channels.

The operation of the means for determining the command to be transmitted is described below.

In this configuration, a group of SSPC channels comprises SSPC channels that are each connected to:
- power lines (Vin, Vout);
- the means (14, 14b, 14n) for determining the command to be transmitted; and
- at least two microcontrollers (1a, 1b), here respectively called master and slave, that receive line voltage measurements, current measurements, switching information (Trip out) or any other quantity required to determine whether the SSPC channel is operating correctly. The measurements may also comprise measurements of the frequency of an alternating current, distortion ratio, the ripple factor of a DC supply and the total harmonic distortion of an AC supply.

Various structures of the means (14, 14b, 14n) for determining the command to be transmitted will now be described. The annotation M signifies that the signal originates from the microcontroller 1a referred to as the master. Conversely, the annotation S signifies that the signal was emitted by the microcontroller 1b referred to as the slave. The master microcontroller and the slave microcontroller are each able to control the SSPC channels, the master microcontroller being the microcontroller the orders of which have priority, the slave microcontroller being the redundant microcontroller ensuring continuity of control in the case of failure of the master microcontroller. However, the roles of master and slave of the microcontrollers may be swapped during configuration.

Figure 5:
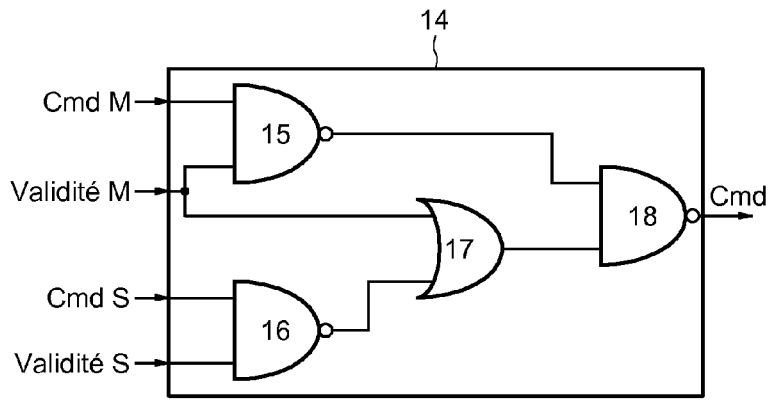
FIG. 5 illustrates a first embodiment of a means for determining the command to be transmitted according to the invention.

In a first embodiment illustrated in FIG. 5, the means for determining the command to be transmitted comprises four inputs connected pairwise to two microcontrollers and one output intended to control one SSPC channel.

The four inputs carry two command signals each originating from one microcontroller, which signals are denoted Cmd M and Cmd S, and two validity signals, which signals are denoted Validity M and Validity S, each also originating from one microcontroller.

The means 14 for determining the command to be transmitted thus obtained comprises a verification of the validity of the command in order to ensure the redundancy, while nonetheless giving priority to the command received from the master controller.

The input carrying the signal Cmd M and the input carrying the signal Validity M are connected to a first NAND logic gate referenced 15.

The input carrying the signal Cmd S and the input carrying the signal Validity S are connected to a second NAND logic gate referenced 16.

The input carrying the signal Validity M and the second NAND logic gate referenced 16 are connected to an OR logic gate referenced 17.

The first NAND logic gate referenced 15 and the OR logic gate referenced 17 are connected to a third NAND logic gate referenced 18. The output of the third NAND logic gate referenced 18 is connected to the output of the means 14 for determining the command to be transmitted.

This structure is simple because it requires only two microcontrollers. The operation of this means for determining the command to be transmitted is based on the verification of the validity of the command and not on the consistency of the commands originating from the at least two microcontrollers.

The table below illustrates a truth table for this embodiment of the means for determining the command to be transmitted.

| Cmd Master | Validity Master | Cmd Slave | Validity Slave | Cmd |
|---|---|---|---|---|
| 0 | 0 | 0 | 0 | 0 |
| 0 | 0 | 0 | 1 | 0 |
| 0 | 0 | 1 | 0 | 0 |
| 0 | 0 | 1 | 1 | 1 |
| 0 | 1 | 0 | 0 | 0 |
| 0 | 1 | 0 | 1 | 0 |
| 0 | 1 | 1 | 0 | 0 |
| 0 | 1 | 1 | 1 | 0 |
| 1 | 0 | 0 | 0 | 0 |
| 1 | 0 | 0 | 1 | 0 |
| 1 | 0 | 1 | 0 | 0 |
| 1 | 0 | 1 | 1 | 1 |
| 1 | 1 | 0 | 0 | 1 |
| 1 | 1 | 0 | 1 | 1 |
| 1 | 1 | 1 | 0 | 1 |
| 1 | 1 | 1 | 1 | 1 |

Figure 6:
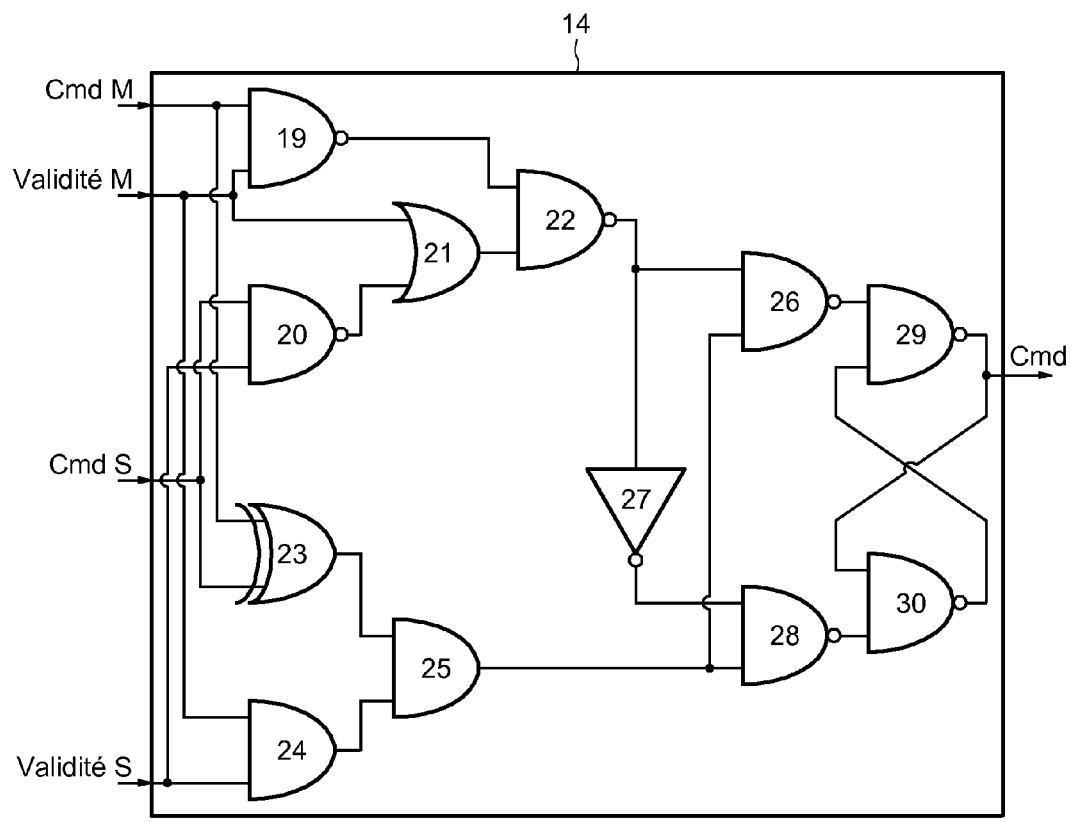
FIG. 6 illustrates a second embodiment of a means for determining the command to be transmitted according to the invention.

In a second embodiment illustrated in FIG. 6, the means for determining the command to be transmitted comprises four inputs connected pairwise to one microcontroller and an output intended to control an SSPC channel.

The four inputs carry two command signals each originating from one microcontroller, which signals are denoted Cmd M and Cmd S, and two validity signals, which signals are denoted Validity M and Validity S, each also originating from one microcontroller.

The means for determining the command to be transmitted thus obtained comprises a verification of the validity of the command in order to ensure the redundancy of the command, while nonetheless giving priority to the preceding command in the case of conflict.

The input carrying the signal Cmd M and the input carrying the signal Validity M are connected to a first NAND logic gate referenced 19.

The input carrying the signal Cmd S and the input carrying the signal Validity S are connected to a second NAND logic gate referenced 20.

The input carrying the signal Validity M and the second NAND logic gate referenced 20 are connected to a first OR logic gate referenced 21.

The first NAND logic gate referenced 19 and the first OR logic gate referenced 21 are connected to a third NAND logic gate referenced 22.

The input carrying the signal Cmd M and the input carrying the signal Cmd S are connected to a second exclusive OR logic gate referenced 23.

The input carrying the signal Validity M and the input carrying the signal Validity S are connected to a fourth AND logic gate referenced 24.

The second exclusive OR logic gate referenced 23 and the fourth AND logic gate referenced 24 are connected to a fifth AND logic gate referenced 25.

The third NAND logic gate referenced 22 and the fifth AND logic gate referenced 25 are connected to a sixth NAND logic gate referenced 26.

The third NAND logic gate referenced 22 is connected to a NOT logic gate referenced 27.

The NOT logic gate referenced 27 and the fifth AND logic gate referenced 25 are connected to a seventh NAND logic gate referenced 28.

The sixth NAND logic gate referenced 26 is connected to the first input of an eighth NAND logic gate referenced 29.

The seventh NAND logic gate referenced 28 is connected to the second input of a ninth NAND logic gate referenced 30. The output of the ninth NAND logic gate referenced 30 is connected to the second input of the eighth NAND logic gate referenced 29. The output of the eighth NAND logic gate referenced 29 is connected to the first input of the ninth NAND logic gate referenced 30.

The output of the eighth NAND logic gate referenced 29 is also connected to the output of the means 14 for determining the command to be transmitted.

This structure is similar to that of the first embodiment. The advantage of this second embodiment resides in the control of the state of the command in case of conflict between received commands that are judged valid.

The table below illustrates a truth table for this embodiment of the means for determining the command to be transmitted.

| Cmd Master | Validity Master | Cmd Slave | Validity Slave | Cmd |
|---|---|---|---|---|
| 0 | 0 | 0 | 0 | 0 |
| 0 | 0 | 0 | 1 | 0 |
| 0 | 0 | 1 | 0 | 0 |
| 0 | 0 | 1 | 1 | 1 |
| 0 | 1 | 0 | 0 | 0 |
| 0 | 1 | 0 | 1 | 0 |
| 0 | 1 | 1 | 0 | 0 |
| 0 | 1 | 1 | 1 | Preceding command |
| 1 | 0 | 0 | 0 | 0 |
| 1 | 0 | 0 | 1 | 0 |
| 1 | 0 | 1 | 0 | 0 |
| 1 | 0 | 1 | 1 | 1 |
| 1 | 1 | 0 | 0 | 1 |
| 1 | 1 | 0 | 1 | Preceding command |
| 1 | 1 | 1 | 0 | 1 |
| 1 | 1 | 1 | 1 | 1 |

Figure 7:
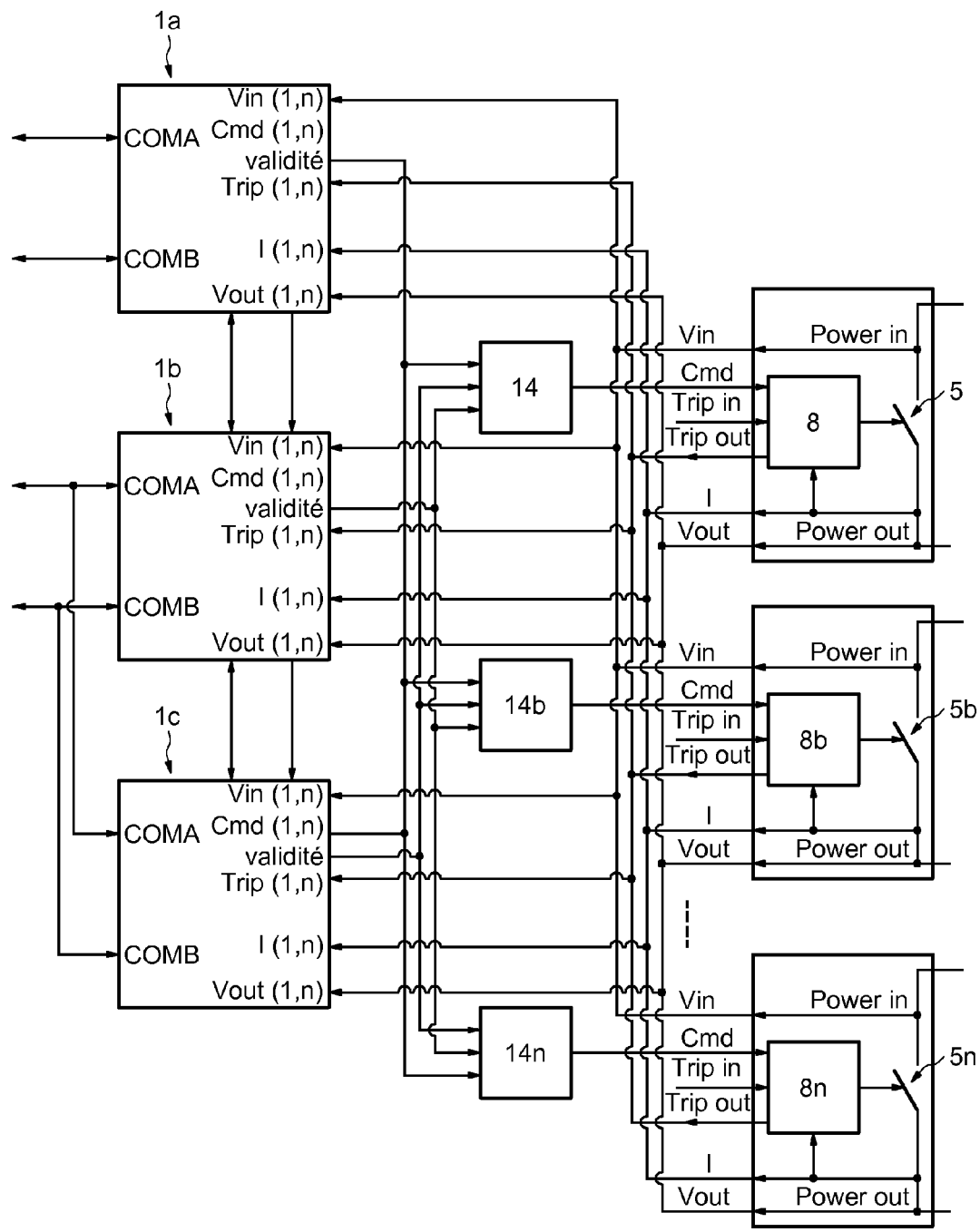
FIG. 7 illustrates another architecture for controlling and protecting channels according to the invention.
Figure 8:
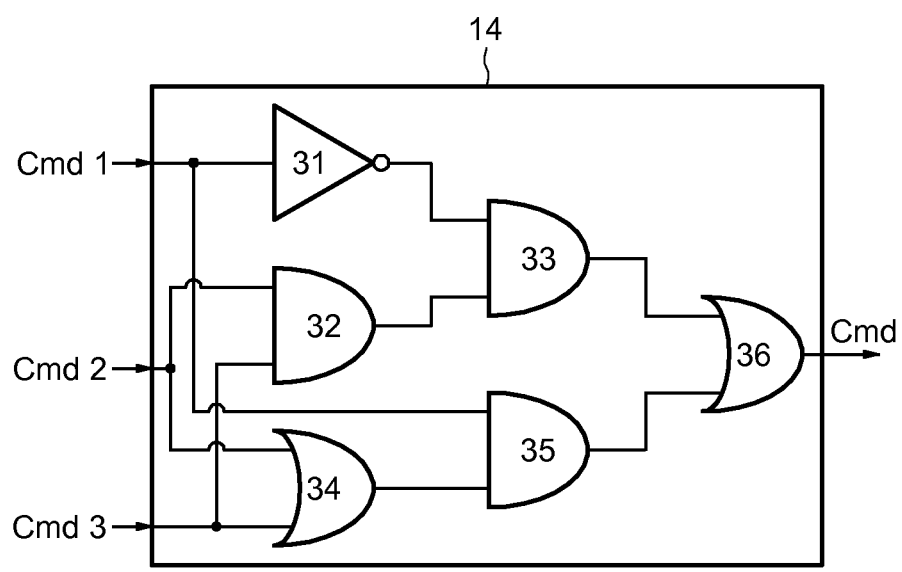
FIG. 8 illustrates a third embodiment of a means for determining the command to be transmitted according to the invention.

As a variant, it is possible to associate more than two microcontrollers in order to generate the command of the SSPC channels by way of a means for determining the command to be transmitted. FIG. 7 illustrates an architecture for controlling and protecting SSPC channels using three microcontrollers. In the context of this architecture, the means (14, 14b, 14n) for determining the command to be transmitted used is able to manage three commands issued by three different microprocessors (1a, 1b, 1c). The rest of the control architecture corresponds to the architecture illustrated in FIG. 4 and described above. Such an embodiment of the means for determining the command to be transmitted is illustrated in FIG. 8. It may be seen that the means for determining the command to be transmitted comprises three inputs each connected to one microcontroller and an output intended to control an SSPC channel. In this example, the three microcontrollers emit commands Cmd1, Cmd2, and Cmd3, respectively.

The signal Cmd emitted as output from the means for determining the command to be transmitted corresponds to the signal mainly received on the three inputs Cmd1, Cmd2 and Cmd3.

The input carrying the command signal Cmd1 is connected to a NOT logic gate referenced 31.

The input carrying the command signal Cmd2 and the input carrying the command signal Cmd3 are connected to a first AND logic gate referenced 32.

The NOT logic gate referenced 31 and the first AND logic gate referenced 32 are connected to a second AND logic gate referenced 33.

The input carrying the command signal Cmd2 and the input carrying the command signal Cmd3 are connected to a first OR logic gate referenced 34.

The input carrying the command signal Cmd1 and the first OR logic gate referenced 34 are connected to a third AND logic gate referenced 35.

The second AND logic gate referenced 33 and the third AND logic gate referenced 35 are connected to a second OR logic gate referenced 36.

The table below illustrates a truth table for this embodiment of the means for determining the command to be transmitted.

| Cmd1 | Cmd2 | Cmd3 | Cmd |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

This control architecture and the corresponding means for determining the command to be transmitted are used for flight commands that require the highest level of safety and availability. This is obtained at the price of using three microcontrollers.

Moreover, it is possible to use an FPGA (field-programmable gate array) or more generally a PLD (programmable logic device) associated with the microcontroller. This FPGA allows the load on the microcontroller to be lightened by carrying out some of the functions that the processor would normally have to carry out. It may for example process digital data and process analogue data by interfacing with one or more ADCs (analogue-to-digital converters); store data in RAM memory; etc.

Figure 9:
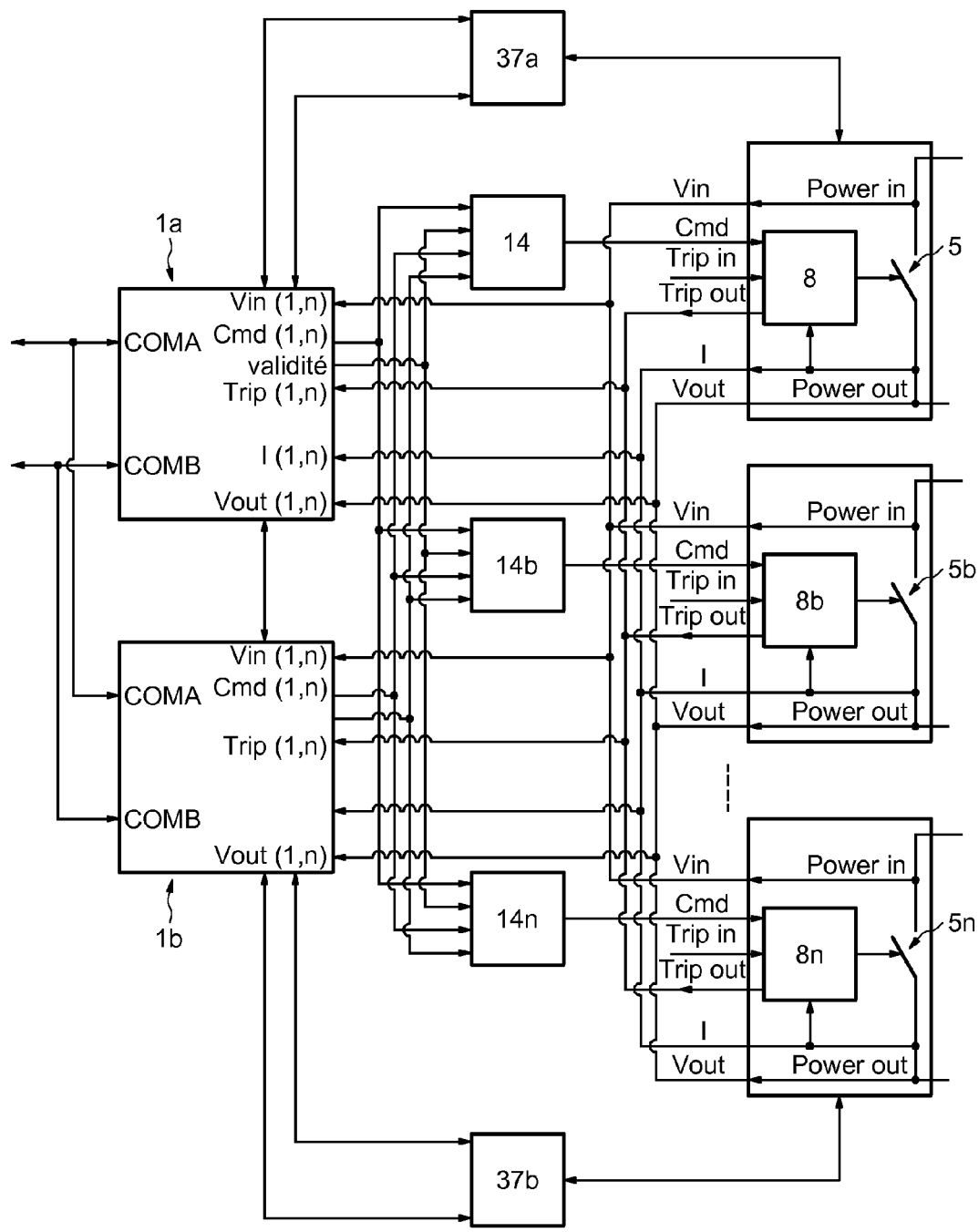
FIG. 9 illustrates another architecture for controlling and protecting channels according to the invention, incorporating FPGAs.

The FPGA may exchange data with the microcontroller via parallel or serial buses or discrete signals. FIG. 9 illustrates such an embodiment, corresponding to that illustrated in FIG. 4, complemented by two FPGAs 37a and 37b each of which is connected between an SSPC channel and a microcontroller.

The embodiments of the invention in which an exclusive property or privilege is claimed are defined as follows:

1. A system, especially for use in aircraft, for controlling at least one switching device (5, 5b, 5n) able to open or close a connection between at least one power source and at least one supplied device, and means for measuring a state of a power supply channel, the system being characterized in that it comprises:
   at least two microcontrollers (1a, 1b) each able to emit a command directed to each of the at least one switching devices (5, 5b, 5n) of a power supply channel, the at least two microcontrollers (1a, 1b) being couplable to at least one portion of the means for measuring the state of the power supply channel, and
   a means (14, 14b, 14n) for determining a command to be transmitted, able to determine the command to be transmitted to each of the at least one switching devices (5, 5b, 5n) from the commands emitted by each of the at least two microcontrollers (1a, 1b) and directed to each of the at least one switching devices (5, 5b, 5n).

2. The system according to claim 1, in which the means (14, 14b, 14n) for determining the command to be transmitted comprise three inputs carrying a command signal originating from three microcontrollers:
   an input carrying a command signal of a first microcontroller (1a) being connected to a NOT logic gate (31),
   an input carrying a command signal of a second microcontroller (1b) and an input carrying the command signal of a third microcontroller (1c) being connected to a first AND logic gate (32),
   the NOT logic gate (31) and the first AND logic gate (32) being connected to a second AND logic gate (33),
   the input carrying the command signal of the second microcontroller (1b) and the input carrying the command signal of the third microcontroller (1c) being connected to a first OR logic gate (34),
   the input carrying the command signal of the first microcontroller (1a) and the first OR logic gate (34) being connected to a third AND logic gate (35),
   the second AND logic gate (33) and the third AND logic gate (35) being connected to a second OR logic gate (36), and
   an output of the second OR logic gate (36) being connected to an output of the means (14, 14b, 14n) for determining the command to be transmitted.

3. The system according to claim 1, in which the means (14, 14b, 14n) for determining the command to be transmitted comprises four inputs connected pairwise to a first microcontroller and a second microcontroller (1a, 1b),
   the four inputs carrying two command signals each originating from one microcontroller, and two validity signals, each also originating from one microcontroller,
   the second microcontroller ensuring the redundancy of the first microcontroller,
   an input carrying a command signal of the first microcontroller (1a) and an input carrying the validity signal of the first microcontroller (1a) being connected to a first NAND logic gate (15),
   an input carrying a command signal of the second microcontroller (1b) and an input carrying a validity signal of the second microcontroller (1b) being connected to a second NAND logic gate (16),
   the input carrying the validity signal of the first microcontroller (1a) and the second NAND logic gate (16) being connected to an OR logic gate (17), and
   the first NAND logic gate (15) and the OR logic gate (17) being connected to a third NAND logic gate (18), an output of the third NAND logic gate (18) being connected to an output of the means (14) for determining the command to be transmitted.

4. The system according to claim 1, in which the means (14, 14b, 14n) for determining the command to be transmitted comprises four inputs connected pairwise to a first microcontroller and a second microcontroller (1a, 1b),
   the four inputs carrying two command signals each originating from one microcontroller, and two validity signals, each also originating from one microcontroller,
   the second microcontroller ensuring the redundancy of the first microcontroller,
   an input carrying a command signal of the first microcontroller (1a) and an input carrying a validity signal of the first microcontroller (1a) are connected to a first NAND logic gate (19),
   an input carrying a command signal of the second microcontroller (1b) and an input carrying a validity signal of the second microcontroller (1b) are connected to a second NAND logic gate (20),
   the input carrying the validity signal of the first microcontroller (1a) and the second NAND logic gate (20) are connected to a first OR logic gate (21),
   the first NAND logic gate (19) and the first OR logic gate (21) are connected to a third NAND logic gate (22),
   the input carrying the command signal of the first microcontroller (1a) and the input carrying the command signal of the second microcontroller (1b) being connected to a second exclusive OR logic gate (23),
   the input carrying the validity signal of the first microcontroller (1a) and the input carrying the validity signal of the second microcontroller (1b) being connected to a fourth AND logic gate (24),
   the second exclusive OR logic gate (23) and the fourth AND logic gate (24) being connected to a fifth AND logic gate (25),
   the third NAND logic gate (22) and the fifth AND logic gate (25) being connected to a sixth NAND logic gate (26), and the third NAND logic gate (22) being connected to a NOT logic gate (27),
   the NOT logic gate (27) and the fifth AND logic gate (25) being connected to a seventh NAND logic gate (28),
   the sixth NAND logic gate (26) being connected to a first input of an eighth NAND logic gate (29),
   the seventh NAND logic gate (28) being connected to the second input of a ninth NAND logic gate (30), an output of the ninth NAND logic gate (30) being connected to a second input of the eighth NAND logic gate (29), an output of the eighth NAND logic gate (29) being connected to a first input of the ninth NAND logic gate (30), and the output of the eighth NAND logic gate (29) also being connected to an output of the means (14) for determining the command to be transmitted.

5. Use of the system according to claim 1, in a power distribution system of an aircraft comprising at least one power supply channel comprising at least one switching device (5, 5*b*, 5*n*).

6. A method, especially for use in aircraft, for controlling at least one switching device (5, 5*b*, 5*n*) able to open or close a connection between at least one power source and at least one supplied device, by means of a control system comprising:

means for measuring a state of the connection, at least two microcontrollers (1*a*, 1*b*) each able to emit a command directed to each of the at least one switching devices (5, 5*b*, 5*n*), the at least two microcontrollers (1*a*, 1*b*) being connected to at least one portion of the means for measuring the state of the connection, and characterized in that it comprises a step in which the command transmitted to each switching device (5, 5*b*, 5*n*) is determined from the commands emitted by the microcontrollers and directed to each of the at least one switching devices (5, 5*b*, 5*n*).

7. The method according to claim 6, in which a command corresponding to the command received from most of the microcontrollers (1*a*, 1*b*, 1*c*) is transmitted as an output, the control system comprising an uneven number of microcontrollers (1*a*, 1*b*, 1*c*) higher than three.

8. The method according to claim 6, in which each of the at least two microcontrollers (1*a*, 1*b*) emits a command able to take a first command value or a second command value and a validity value able to take a first validity value if the command is judged valid by a first microcontroller of the at least two microcontrollers and a second validity value if the command is judged invalid by the first microcontroller, a second microcontroller ensuring the redundancy of the first microcontroller, if the commands received as inputs are accompanied by different validity values, the command received as input for which the validity value corresponds to the first command value is transmitted, or, if different commands received as inputs are accompanied by validity values corresponding to the second validity value, the first command value is transmitted, or, if identical commands received as inputs are accompanied by validity values corresponding to the second validity value, the first command value is transmitted.

9. The method according to claim 8, in which if different commands received as inputs are accompanied by validity values corresponding to the first command value, the command transmitted by the first microcontroller is transmitted.

10. The method according to claim 8, in which if different commands received as inputs are accompanied by validity values corresponding to the first command value, the command received beforehand is transmitted.

11. Use of the method according to claim 6, to control a power distribution system of an aircraft comprising at least one power supply channel comprising at least one switching device (5, 5*b*, 5*n*).

* * * * *